(12) United States Patent
Kim et al.

(10) Patent No.: US 9,704,854 B2
(45) Date of Patent: Jul. 11, 2017

(54) DC-TO-DC CONVERTER AND METHOD FOR FABRICATING THE SAME

(71) Applicant: SK hynix Inc., Gyeonggi-do (KR)

(72) Inventors: Heon-Joon Kim, Gyeonggi-do (KR); Jae-Ho Hwang, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 6 days.

(21) Appl. No.: 14/333,329

(22) Filed: Jul. 16, 2014

(65) Prior Publication Data
US 2015/0229208 A1   Aug. 13, 2015

(30) Foreign Application Priority Data
Feb. 11, 2014   (KR) .................. 10-2014-0015391

(51) Int. Cl.
| H01L 49/02 | (2006.01) |
| H01L 27/06 | (2006.01) |
| H01L 23/522 | (2006.01) |
| H02M 3/00 | (2006.01) |

(52) U.S. Cl.
CPC ...... H01L 27/0629 (2013.01); H01L 23/5223 (2013.01); H01L 28/87 (2013.01); H01L 28/91 (2013.01); *H01L 2924/0002* (2013.01); *H02M 3/00* (2013.01)

(58) Field of Classification Search
CPC ..... H01L 28/40; H01L 28/91; H01L 23/5222; H01L 23/5223; H01L 27/0288; H01L 27/0629; H01L 27/10805; H01L 27/10852
USPC ................................. 11/299, 300
See application file for complete search history.

(56) References Cited

U.S. PATENT DOCUMENTS

| 6,180,976 | B1* | 1/2001 | Roy ............................... 257/306 |
| 7,825,446 | B2 | 11/2010 | Takahashi et al. |
| 2004/0137693 | A1 | 7/2004 | Kim |
| 2009/0243039 | A1 | 10/2009 | Kim |
| 2010/0032803 | A1* | 2/2010 | Lippitt, III .......... H01L 23/5223 257/534 |
| 2010/0065944 | A1* | 3/2010 | Tu ....................... H01L 23/5223 257/532 |
| 2010/0213573 | A1* | 8/2010 | Han .................... H01L 23/5223 257/532 |
| 2012/0091519 | A1* | 4/2012 | Tu ....................... H01L 23/5223 257/303 |
| 2012/0091559 | A1* | 4/2012 | Tu ....................... H01L 23/5223 257/532 |

(Continued)

FOREIGN PATENT DOCUMENTS

| KR | 100268776 | 10/2000 |
| KR | 1020040093910 | 11/2004 |
| KR | 1020100077773 | 7/2010 |

*Primary Examiner* — Jerome Jackson, Jr.
*Assistant Examiner* — David Spalla
(74) *Attorney, Agent, or Firm* — IP & T Group LLP

(57) ABSTRACT

A DC-to-DC converter includes: a substrate having a switching element region defined by an isolation layer; a transistor formed over the switching element region; a landing plate formed over the isolation layer; a capacitor formed over the landing plate and includes a bottom plate, a dielectric layer and a top plate; multi-layer metal lines disposed in an upper portion of the transistor and coupled with the transistor; and an interconnection portion coupled with the multi-layer metal lines to electrically connect the transistor with the capacitor.

13 Claims, 12 Drawing Sheets

(56) References Cited

U.S. PATENT DOCUMENTS

2012/0132968 A1\* 5/2012 Choi ................... H01L 23/5223
                                                                257/296
2013/0242643 A1\* 9/2013 Kim ........................ G11C 5/14
                                                                365/149

\* cited by examiner

DC-TO-DC CONVERTER AND METHOD FOR FABRICATING THE SAME

CROSS-REFERENCE TO RELATED APPLICATIONS

The present application claims priority of Korean Patent Application No. 10-2014-0015391, filed on Feb. 11, 2014, which is incorporated herein by reference in its entirety.

BACKGROUND

1. Field

Exemplary embodiments of the present invention relate to a Direct Current-to-Direct Current (hereafter, referred to as "DC-to-DC") converter and a method for fabricating the same, and more particularly, to a DC-to-DC converter having a capacitor and a method for fabricating the same.

2. Description of the Related Art

Generally, a reservoir capacitor is formed in a peripheral circuit region. In a DC-to-DC converter which requires a large-capacity capacitor, the capacitor is formed over a substrate in the outside of a chip and used. However, this method has a problem in that it occupies a large portion of a total area of a device.

SUMMARY

Exemplary embodiments of the present invention are directed to a DC-to-DC converter capable of reducing the size of an occupying area in a device by forming a large-capacity capacitor in the inside of a chip, and a method for fabricating the DC-to-DC converter.

In accordance with an embodiment of the present invention, a DC-to-DC converter includes: a substrate in which a switching element region is defined by an isolation layer; a transistor formed over the switching element region; a landing plate formed over the isolation layer; a capacitor formed over the landing plate and including a bottom plate, a dielectric layer and a top plate; multi-layer metal lines disposed in an upper portion of the transistor and coupled with the transistor; and an interconnection portion coupled with the multi-layer metal lines to electrically connect the transistor with the capacitor.

In accordance with another embodiment of the present invention, a method for fabricating a DC-to-DC converter includes: preparing a substrate in which a switching element region is defined by an isolation layer; forming a transistor over the switching element region; forming a landing plate over the isolation layer; forming multi-layer metal lines in an upper portion of the transistor to be coupled with the transistor; forming a capacitor including a bottom plate, a dielectric layer and a top plate over the landing plate; forming a via including a via hole, a barrier metal and a first via plug over the uppermost metal line of the multi-layer metal lines; forming a second via plug over the capacitor; and forming interconnection lines over the first and second via plugs. The method, may further comprise forming a via including a via hole, a barrier metal and a first via plug over the uppermost metal line of the multi-layer metal lines; forming a second via plug over the capacitor; and forming interconnection lines over the first and second via plugs. The forming of the capacitor may include: forming an inter-layer insulation layer over the landing plate; forming a plurality of openings in the inter-layer insulation layer over the landing plate; forming the cylindrical bottom plate continuing along the openings; forming the dielectric layer over the bottom plate; and forming the top plate over the dielectric layer. The landing plate may be formed over the isolation layer when a gate electrode of the transistor is formed. The landing plate may be formed of the same material as the gate electrode of the transistor. The landing plate may be formed over the isolation layer when the lowermost-layer metal line of the multi-layer metal lines is formed. The landing plate may be formed of the same material as the lowermost metal line of the multi-layer metal lines. The forming of the via may include: forming a via hole by etching the inter-layer insulation layer over the uppermost metal line of the multi-layer metal lines; forming the barrier metal in the via hole; and forming the first via plug which gap-fills the via hole. The barrier metal may be continuously extended to the uppermost metal line from the top plate of the capacitor. The dielectric layer of the capacitor may be extended to overlap with an upper portion of the multi-layer metal lines.

DETAILED DESCRIPTION

Figure 1:
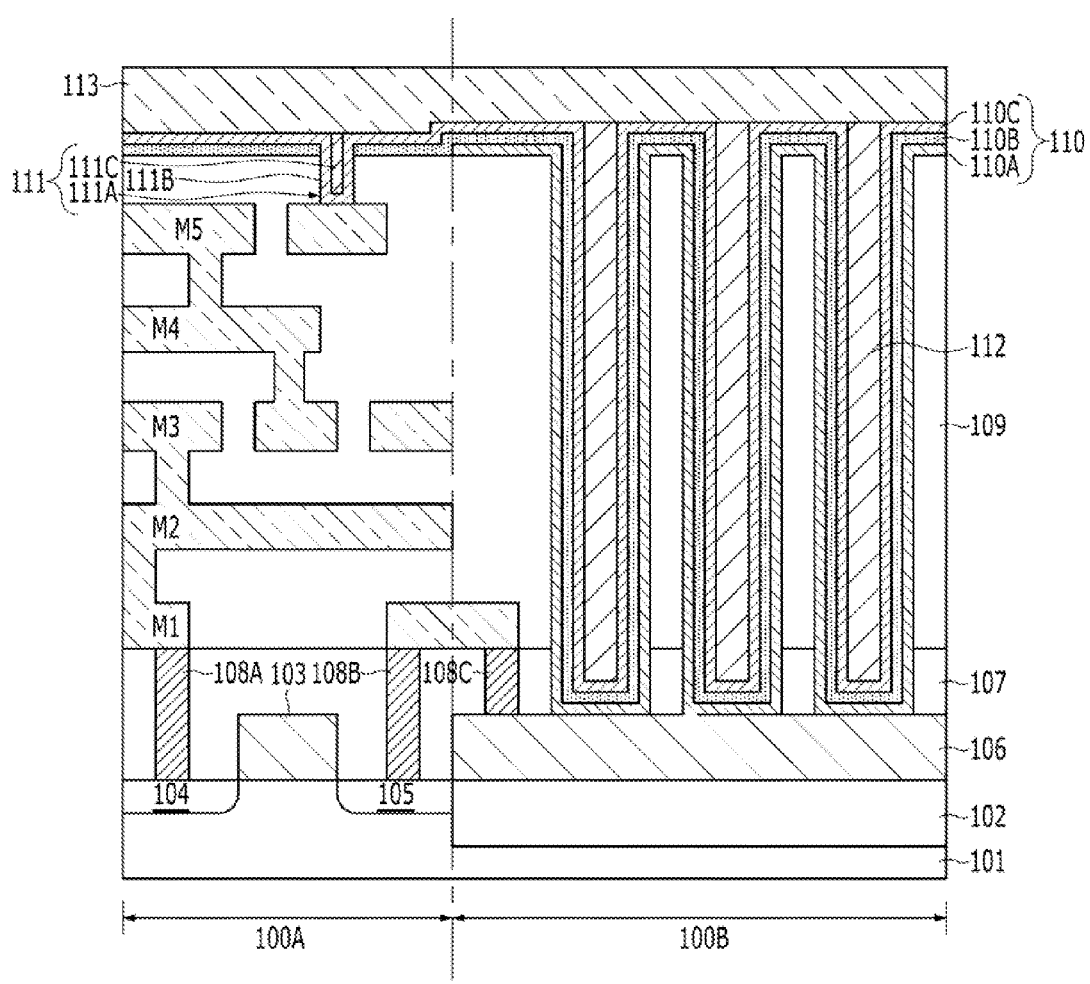
FIG. 1 is a cross-sectional view exemplarily illustrating a DC-to-DC converter in accordance with a first embodiment of the present invention.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

FIG. 1 is a cross-sectional view exemplarily illustrating a DC-to-DC converter in accordance with a first embodiment of the present invention.

Referring to FIG. 1, an isolation layer 102 is formed in a substrate 101. The substrate 101 includes a first region (e.g., an active region) 100A which is defined by the isolation layer 102 and a second region (e.g., an isolation region) 100B in which the isolation layer 102 is formed. The first region 100A may include a switching element region, and the second region 100B may include a capacitor region. The substrate 101 may include a silicon substrate, a silicon-germanium (SiGe) substrate or a silicon-on-insulator (SOI) substrate.

A switching element is formed over the substrate 101 of the first region 100A. The switching element includes a transistor. The transistor includes a gate electrode 103, a source region 104 and a drain region 105. A sidewall spacer (not shown) may be formed on the sidewalls of the gate electrode 103. The gate electrode 103 may include a silicon-containing layer. For example, the gate electrode 103 may include a poly-silicon layer. The gate electrode 103 may be formed of an undoped silicon layer which is not doped with any impurity or a doped silicon layer which is doped with an impurity.

A landing plate 106 is formed over the substrate 101 of the first region 100B. The landing plate 106 may be disposed at the same surface level as the gate electrode 103 of the transistor. The landing plate 106 is formed of the same material as the gate electrode 103.

A first inter-layer insulation layer 107 is formed to cover the first region 100A and the second region 100B. The first inter-layer insulation layer 107 includes a plurality of contact plugs. The contact plugs include a first contact plug 108A, a second contact plug 108B and a third contact plug 108C. The first contact plug 108A may be coupled with the source region 104, and the second contact plug 108B may be coupled with the drain region 105, and the third contact plug 108C may be coupled with the landing plate 106. The first inter-layer insulation layer 107 may be one selected from the group consisting of an oxide layer, a nitride layer and an oxynitride layer. The first inter-layer insulation layer 107 may include an oxide layer. The contact plugs may include a metal layer, a metal nitride layer, a noble metal layer, a heat-resisting metal layer, a poly-silicon, etc.

A second inter-layer insulation layer 109 is formed over the first inter-layer insulation layer 107. The second inter-layer insulation layer 109 of the first region 100A includes multi-layer metal lines. The multi-layer metal lines are formed in the upper portion of the transistor. The multi-layer metal lines are selectively coupled by a metal contact. The multi-layer metal lines include at least the lowermost metal line and the uppermost metal line. For example, the multi-layer metal lines include a first metal line M1, a second metal line M2, a third metal line M3, a fourth metal line M4 and a fifth metal line M5. The first metal line M1 may be the lowermost metal line, and the fifth metal line M5 may be the uppermost metal line. The first metal line M1 is coupled with the contact plugs. The first metal line M1 which is coupled with the second contact plug 108B and the third contact plug 108C may be referred to as a first interconnection portion which couples the landing plate 106 with the transistor.

A capacitor 110 is formed over the landing plate 106 of the second region 100B. The capacitor 110 includes a cylindrical bottom plate 110A, a dielectric layer 110B and a top plate 110C. The bottom plate 110A has a structure of being coupled with the landing plate 106 in the form of continuum and extended to a boundary line between the first region 100A and the second region 100B. The dielectric layer 110B has a structure of being extended to overlap with the upper portions of the multi-layer metal lines. The bottom plate 110A and the top plate 110C include a titanium-containing layer. The bottom plate 110A and the top plate 110C may be formed of one selected from the group consisting of a titanium layer and a titanium nitride layer. For example, the bottom plate 110A and the top plate 110C may include a titanium nitride layer. This is due to stack coverage being superior. The dielectric layer 110B includes a high-k material. The high-k material may be one selected from the group consisting of hafnium dioxide ($HfO_2$), zirconium dioxide ($ZrO_2$), titanium dioxide ($TiO_2$), tantalum pentoxide ($TA_2O_5$) and strontium titanate $STO(SrTiO_3)$. The dielectric layer 110B may be a single layer of one selected from the group or a stacked layer thereof. For example, the dielectric layer 110B may be a zirconium dioxide layer ($ZrO_2$).

A second interconnection portion is formed to couple the fifth metal line M5 with the top plate 110C. The second interconnection portion includes a via 111 formed over the fifth metal line M5, a second via plug 112 formed over the capacitor 110, and interconnection lines 113 formed over the via 111 and the second via plug 112. The via 111 includes a via hole 111A, a barrier metal 111B formed in the via hole 111A and a first via plug 111C formed over the barrier metal 111B. The barrier metal 111B has a structure where it is extended continuously to the fifth metal line M5 from the top plate 110C of the capacitor 110. The first via plug 111O and the second via plug 112 may be formed of a metallic layer. The metallic layer may include a metal layer, a metal oxide layer, metal nitride layer, etc. For example, the first via plug 111C and the second via plug 112 may include a tungsten layer. The interconnection lines 113 may include the same material as the multi-layer metal lines.

Figure 2:
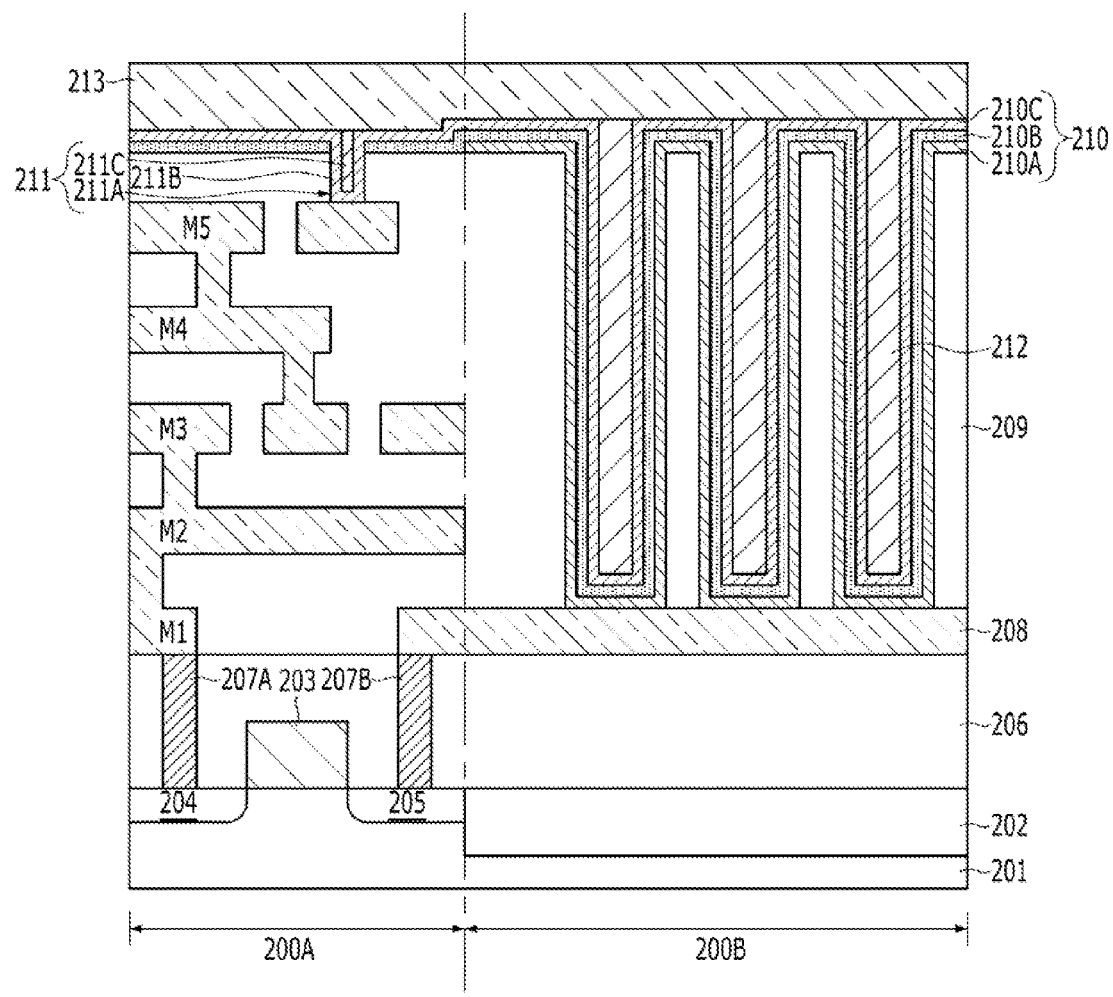
FIG. 2 is a cross-sectional view exemplarily illustrating a DC-to-DC converter in accordance with a second embodiment of the present invention.

FIG. 2 is a cross-sectional view exemplarily illustrating a DC-to-DC converter in accordance with a second embodiment of the present invention.

Referring to FIG. 2, an isolation layer 202 is formed in a substrate 201. The substrate 201 includes a first region 200A which is defined by the isolation layer 202 and a second region 200B in which the isolation layer 202 is formed. The first region 200A may include a switching element region, and the second region 200B may include a capacitor region. The substrate 201 may include a silicon substrate, a silicon-germanium (SiGe) substrate or an SOI substrate.

A transistor is formed over the substrate 201 of the first region 200A. The transistor includes a gate electrode 203, a source region 204 and a drain region 205. A sidewall spacer (not shown) may be formed on the sidewalls of the gate electrode 203. The gate electrode 203 may include a silicon-containing layer. For example, the gate electrode 203 may include a poly-silicon layer. The gate electrode 203 may be formed of an undoped silicon layer which is not doped with any impurity or a doped silicon layer which is doped with an impurity.

A first inter-layer insulation layer 206 is formed to cover the first region 200A and the second region 200B. The first inter-layer insulation layer 206 includes a plurality of contact plugs. The contact plugs include a first contact plug 207A and a second contact plug 207B. The first contact plug 207A may be coupled with the source region 204, and the second contact plug 207B may be coupled with the drain region 205. The first inter-layer insulation layer 206 may be one selected from the group consisting of an oxide layer, a nitride layer and an oxynitride layer. The first inter-layer insulation layer 206 may include an oxide layer. The contact plugs may include a metal layer, a metal nitride layer, a noble metal layer, a heat-resisting metal layer, a poly-silicon etc.

A second inter-layer insulation layer 209 is formed over the first inter-layer insulation layer 206. The second inter-layer insulation layer 209 of the first region 200A includes multi-layer metal lines. The multi-layer metal lines are formed in the upper portion of the transistor. The multi-layer metal lines are selectively coupled by a metal contact. The multi-layer metal lines include at least the lowermost-layer metal line and the uppermost metal line. For example, the multi-layer metal lines include a first metal line M1, a second metal line M2, a third metal line M3, a fourth metal line M4 and a fifth metal line M. The first metal line M1 may be the lowermost metal line, and the fifth metal line M5 may be the uppermost metal line.

A landing plate 208 is formed over the first inter-layer insulation layer 206 of the first region 200B. The landing plate 208 may be disposed at the same surface level as the first metal line M1. The landing plate 208 may be coupled with the second contact plug 207B. The landing plate 208 is formed of the same material as the multi-layer metal lines.

A capacitor 210 is formed over the landing plate 208 of the second region 200B. The capacitor 210 includes a cylindrical bottom plate 210A, a dielectric layer 210B and a top plate 210C. The capacitor 210 may be formed around the multi-layer metal lines. The bottom plate 210A has a structure of being coupled with the landing plate 208 in the form of continuum and extended to a boundary line between the first region 200A and the second region 200B. The dielectric layer 210B has a structure of being extended to overlap with the upper portions of the multi-layer metal lines. The bottom plate 210A and the top plate 210C include a titanium-containing layer. The bottom plate 210A and the top plate 210C may be formed of one selected from the group consisting of a titanium layer and a titanium nitride layer. For example, the bottom plate 210A and the top plate 210C may include a titanium nitride layer. This is due to stack coverage being superior. The dielectric layer 210B includes a high-k material. The high-k material may be formed of one selected from the group consisting of hafnium dioxide ($HfO_2$), zirconium dioxide ($ZrO_2$), titanium dioxide ($TiO_2$), tantalum pentoxide ($TA_2O_5$) and strontium titanate STO ($SrTiO_3$). The dielectric layer 210B may be a single layer of one selected from the group or a stacked layer thereof. For example, the dielectric layer 210B may be a zirconium dioxide layer ($ZrO_2$).

An interconnection portion is formed to couple the fifth metal line M5 with the top plate 210C. The interconnection portion includes a via 211 formed over the fifth metal line M5, a second via plug 212 formed over the capacitor 210 and interconnection lines 213 formed over the via 211 and the second via plug 212. The via 211 includes a via hole 211A, a barrier metal 211B formed in the via hole 211A, and a first via plug 211C formed over the barrier metal 2115. The barrier metal 211B has a structure where it is extended continuously to the fifth metal line M5 from the top plate 210C of the capacitor 210. The first via plug 211C and the second via plug 212 may be formed of a metallic layer. The metallic layer may include a metal layer, a metal oxide layer, metal nitride layer, etc. For example, the first via plug 211C and the second via plug 212 may include a tungsten layer. The interconnection lines 213 may include the same material as the multi-layer metal lines.

FIGS. 3A to 3K are cross-sectional views exemplarily illustrating a method for fabricating the DC-to-DC converter in accordance with the first embodiment of the present invention.

Figure 3A:
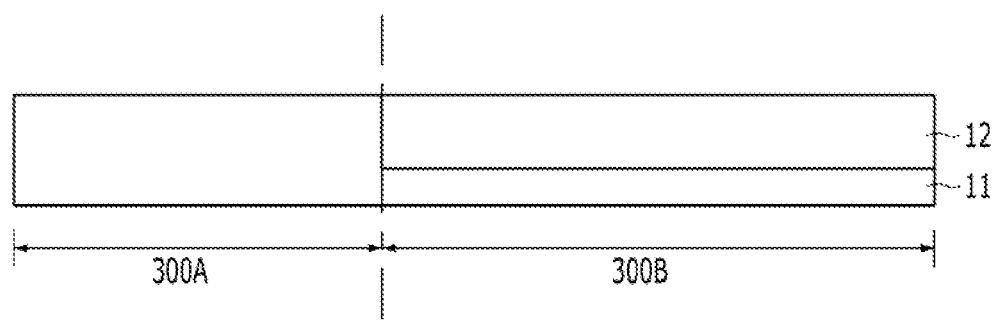
FIGS. 3A to 3K are cross-sectional views exemplarily illustrating a method for fabricating the DC-to-DC converter in accordance with the first embodiment of the present invention.

Referring to FIG. 3A, an isolation layer 12 is formed in a substrate 11. The substrate 11 includes a first region 300A which is defined by the isolation layer 12 and a second region 300B in which the isolation layer 12 is formed. The first region 300A may include a switching element region, and the second region 3006 may include a capacitor region. The substrate 11 includes a semiconductor substrate 11. The semiconductor substrate 11 may include a silicon substrate, a silicon-germanium (SiGe) substrate or an SOI substrate, The isolation layer 12 may be formed through a Shallow Trench Isolation (STI) process.

Figure 3B:
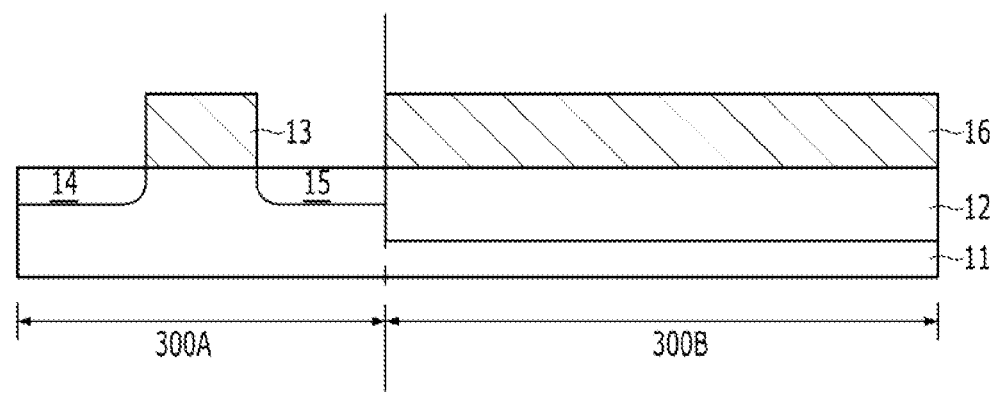

Referring to FIG. 3B, a transistor is formed over the substrate 11 of the first region 300A. The transistor includes a gate electrode 13, a source region 14 and a drain region 15. In order to form the transistor, a first conductive layer (not shown) is formed over the substrate 11. The first conductive layer may include a silicon-containing layer. For example, the first conductive layer may include a poly-silicon layer. The first conductive layer may be formed of an undoped silicon layer which is not doped with any impurity or a doped silicon layer which is doped with an impurity. Subsequently, a first hard mask (not shown) is formed over the first conductive layer. A first hard mask pattern is formed by patterning the first hard mask through a sensitive layer (not shown). A gate electrode 13 is formed by etching the first conductive layer using the first hard mask pattern as an etch barrier.

When the gate electrode 13 is formed, a landing plate 16 is formed over the substrate 11 of the second region 300B. The landing plate 16 may be formed simultaneously with the gate electrode 13. The landing plate 16 includes the same material as the gate electrode 13. After the gate electrode 13 and the landing plate 16 are formed, the high-concentration source region 14 and drain region 15 are formed.

Figure 3C:
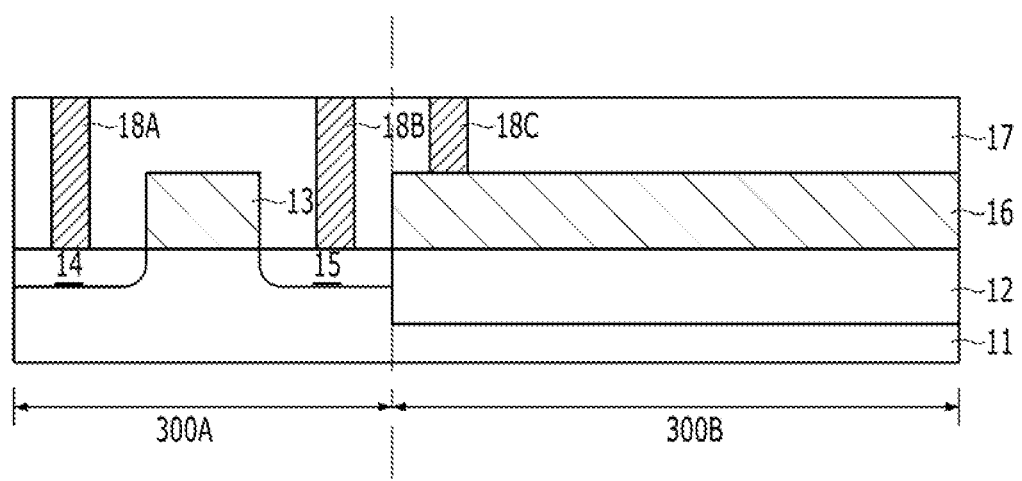

Referring to FIG. 3C, a first inter-layer dielectric layer 17 is formed over the substrate 11. The first inter-layer dielectric layer 17 may be one selected from the group consisting of an oxide layer, a nitride layer and an oxynitride layer. The first inter-layer dielectric layer 17 may include an oxide layer. The first inter-layer dielectric layer 17 includes a plurality of contact plugs. For example, the contact plugs include a first contact plug 18A, a second contact plug 18B and a third contact plug 18C. The first contact plug 18A may be coupled with the source region 14, and the second contact plug 18B may be coupled with the drain region 15, and the third contact plug 18C may be coupled with the landing plate 16. To form the contact plugs, a plurality of contact holes (not shown) are formed in the first inter-layer dielectric layer 17. After a conductive layer is formed in the contact holes, the contact plugs may be formed by planarizing the conductive layer to expose the upper portion of the first inter-layer dielectric layer 17. The contact plugs may include a metal layer, a metal nitride layer a noble metal layer, a heat-resisting metal layer, a poly-silicon etc.

Figure 3D:
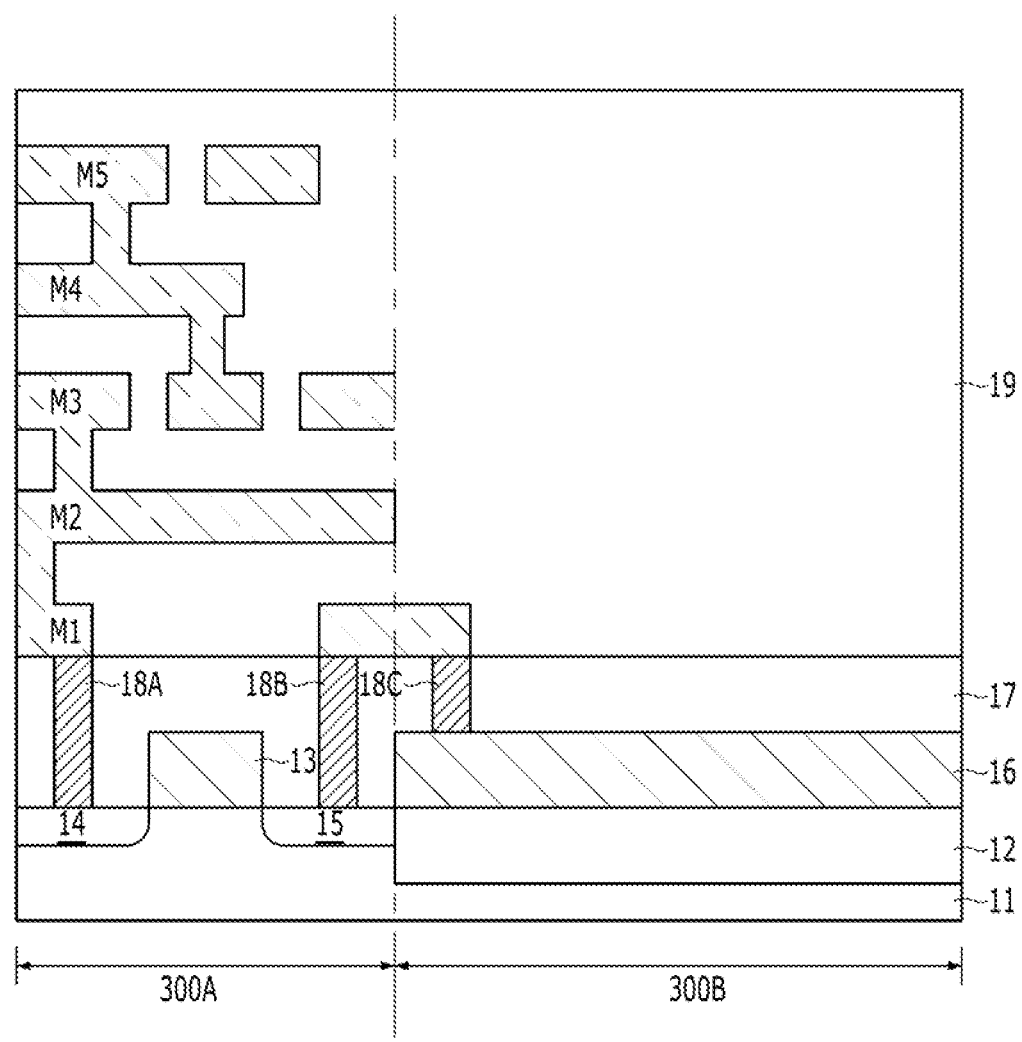

Referring to FIG. 3D, a second inter-layer insulation layer 19 including multi-layer metal lines is formed. The multi-layer metal lines may be formed in the upper portion of the transistor of the first region 300A. The multi-layer metal lines are selectively coupled by a metal contact. The multi-layer metal lines include at least the lowermost metal line and the uppermost metal line. For example, the multi-layer metal lines include a first metal line M1, a second metal line M2, a third metal line M3, a fourth metal line M4 and a fifth metal line M5. The first metal line M1 may be the lowermost metal line, and the fifth metal line M5 may be the uppermost metal line. The first metal line M1 is formed over the first to third contact plugs 18A to 18C. The landing plate 16 may be coupled with the transistor by the first metal line M1 which is coupled with the second and third contact plugs 18B and 18C.

The second inter-layer insulation layer 19 may be one selected from the group consisting of an oxide layer, a nitride layer and an oxynitride layer. The second inter-layer insulation layer 19 may include an oxide layer. The thickness of the second inter-layer insulation layer 19 may be controlled based on capacitance which is required for a capacitor to be formed through a subsequent process. Since the height of the capacitor is determined based on the thickness of the second inter-layer insulation layer 19, the thickness of the second inter-layer insulation layer 19 may be controlled to form the capacitor having the required capacitance. Therefore, a high capacitor may be formed.

Figure 3E:
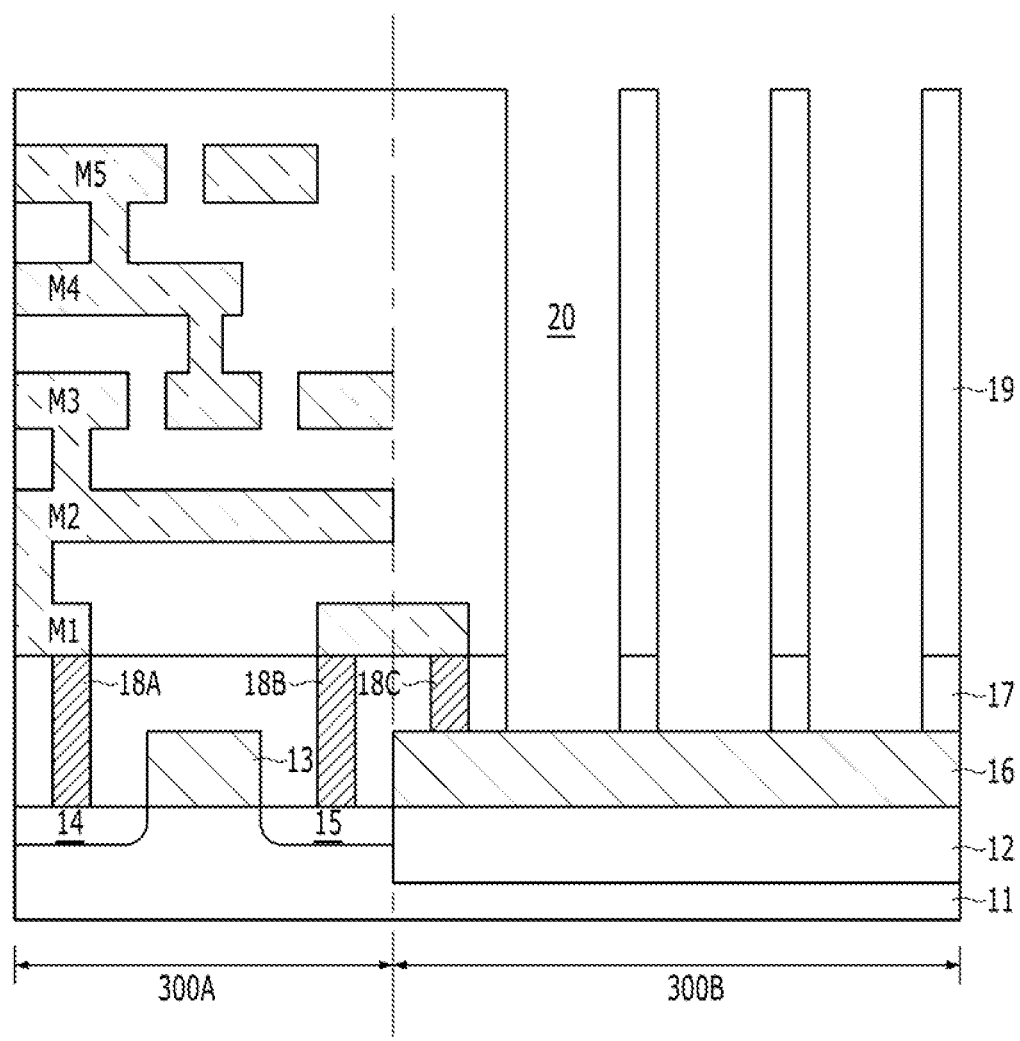

Referring to FIG. 3E, a plurality of openings 20 are formed in the first and second inter-layer insulation layers 17 and 19 of the second region 300B. The openings 20 may expose the landing plate 16 by selectively etching the first and second inter-layer insulation layers 17 and 19. The etch process for forming the openings 20 may include a dry etch process. The sidewalls of the openings 20 may have a vertical profile or an inclined profile. Each opening 20 is a three-dimensional (3D) structure in which a lower electrode of the capacitor is formed through a subsequent process.

Figure 3F:
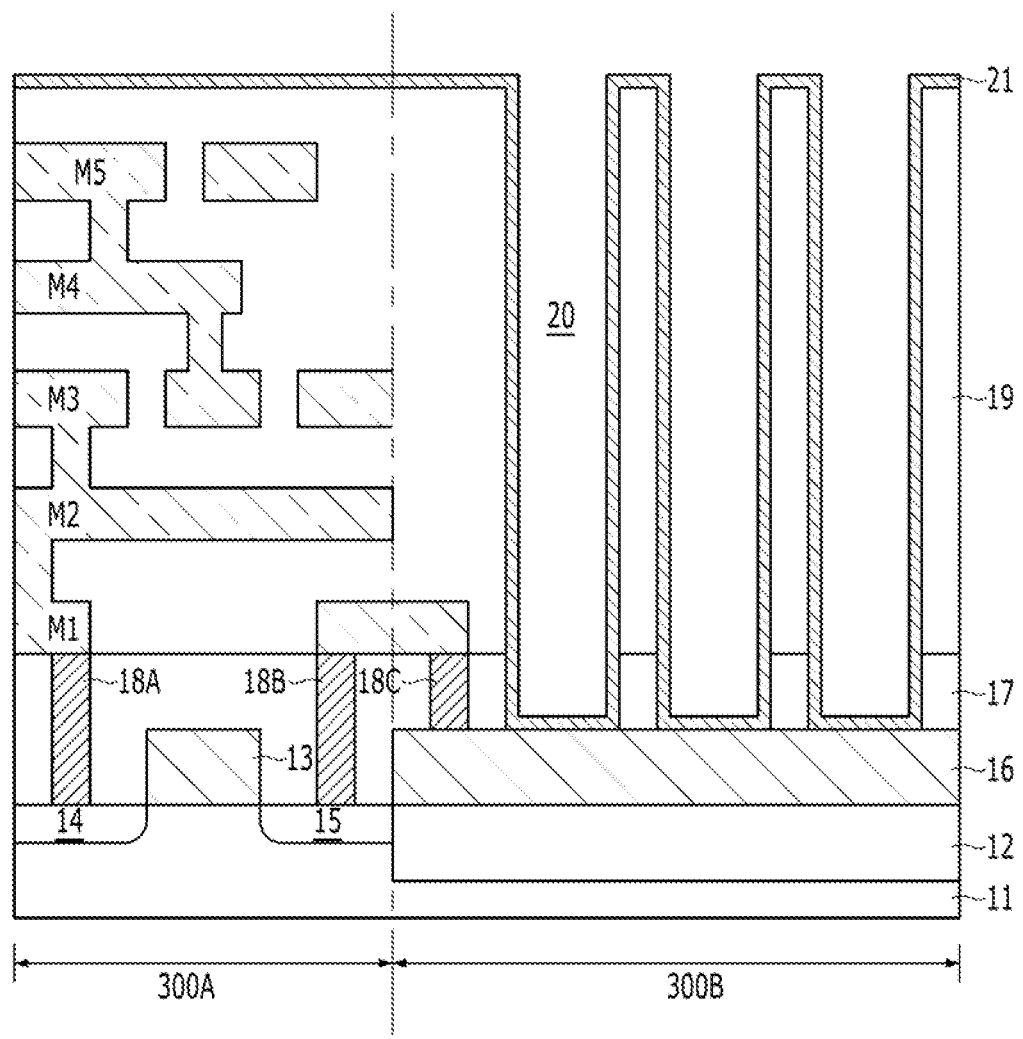

Referring to FIG. 3F, a second conductive layer 21 is formed over the structure including the openings 20. The second conductive layer 21 is formed to have such a thickness that it does not gap-fill the openings 20. The second conductive layer 21 includes a titanium-containing layer. The second conductive layer 21 may be formed of one selected from the group consisting of a titanium layer and a titanium nitride layer. For example, the second conductive layer 21 may include a titanium nitride layer. This is due to stack coverage being superior. The second conductive layer 21 may be formed through an Atomic Layer Deposition (ALD) process or a Chemical Vapor Deposition (CVD) process.

A second hard mask pattern (not shown) is formed over the second conductive layer 21 of the second region 300B. The second hard mask pattern may be formed by patterning the second hard mask through a sensitive layer (not shown).

Figure 3G:
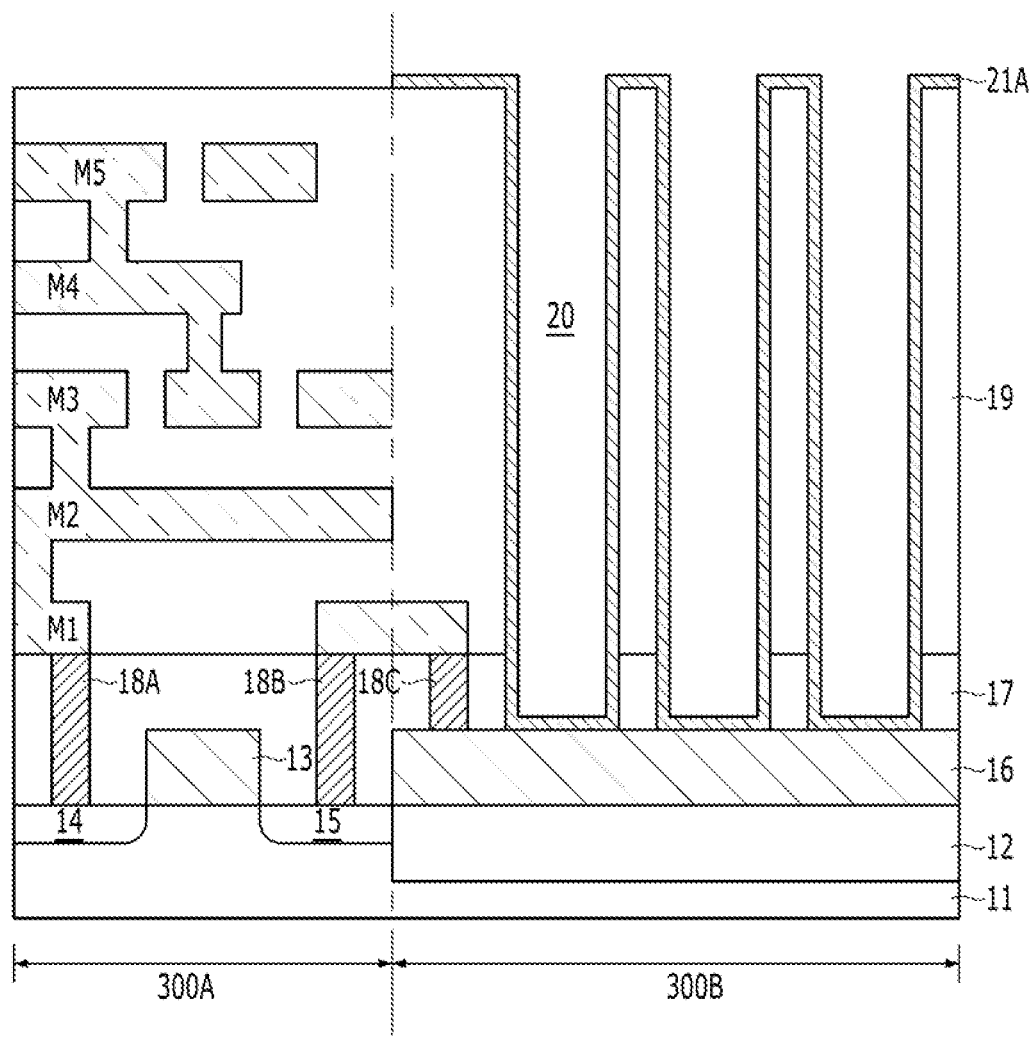

Referring to FIG. 3G, the second conductive layer 21 of the first region 300A is etched using the second hard mask pattern as an etch barrier. As a result, a bottom plate 21A is formed in the second region 300B. The bottom plate 21A may have a successive cylindrical shape. The bottom plate 21A is formed in the second region 300B so as to stably block the landing plate 16 and a top plate 24 to be formed through a subsequent process.

Figure 3H:
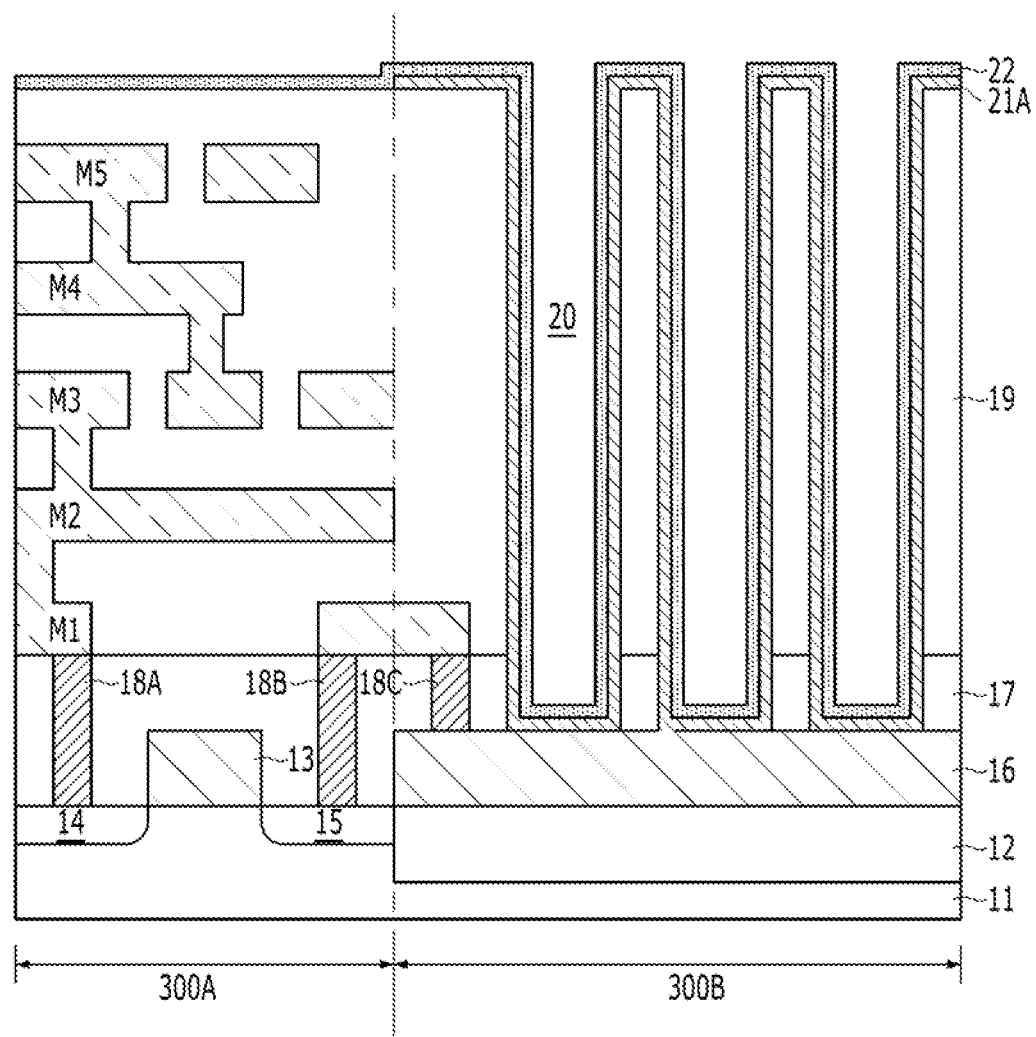

Referring to FIG. 3H, a dielectric layer 22 is formed over the structure including the bottom plate 21A. The dielectric layer 22 is formed to have such a thickness that it does not gap-fill the openings 20. The dielectric layer 22 includes a high-k material. The high-k material may be one selected from the group consisting of hafnium dioxide ($HfO_2$), zirconium dioxide ($ZrO_2$), titanium dioxide ($TiO_2$), tantalum pentoxide ($TA_2O_5$) and strontium titanate STO($SrTiO_3$). The dielectric layer may be a single layer of one selected from the group or a stacked layer thereof. For example, the dielectric layer 22 may be a zirconium dioxide layer ($ZrO_2$). The dielectric layer 22 is formed using an Atomic Layer Deposition (ALD) process which has excellent step coverage characteristics.

Figure 3I:
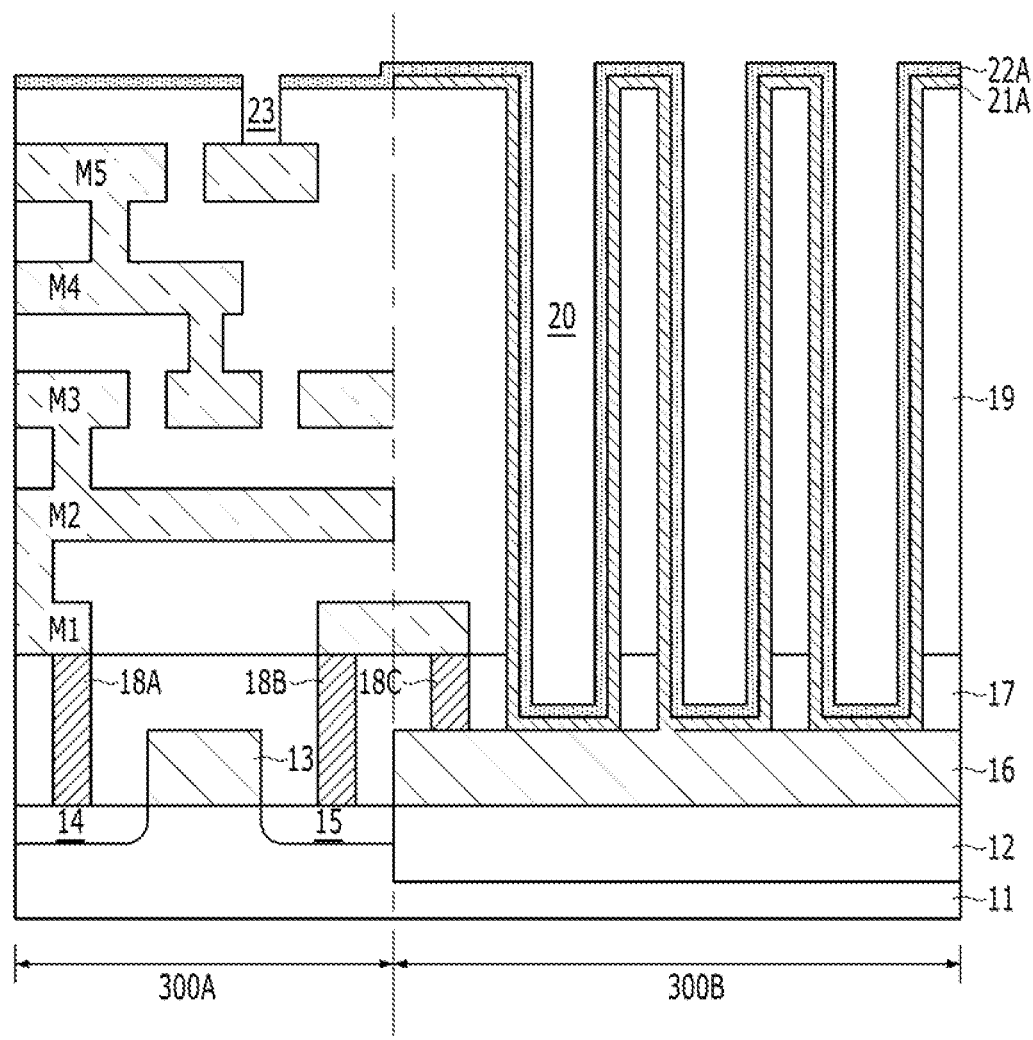

Referring to FIG. 3I, a dielectric layer pattern 22A is formed. The dielectric layer pattern 22A may be formed by patterning the dielectric layer 22 through a sensitive layer (not shown). The dielectric layer pattern 22A of the first region 300A may be used as a hard mask for forming a via hole. The second inter-layer insulation layer 19 of the first region 300A is etched using the dielectric layer pattern 22A of the first region 300A as an etch barrier and a via hole 23 may be formed. The via hole 23 may expose the surface of the fifth metal line M5.

Figure 3J:
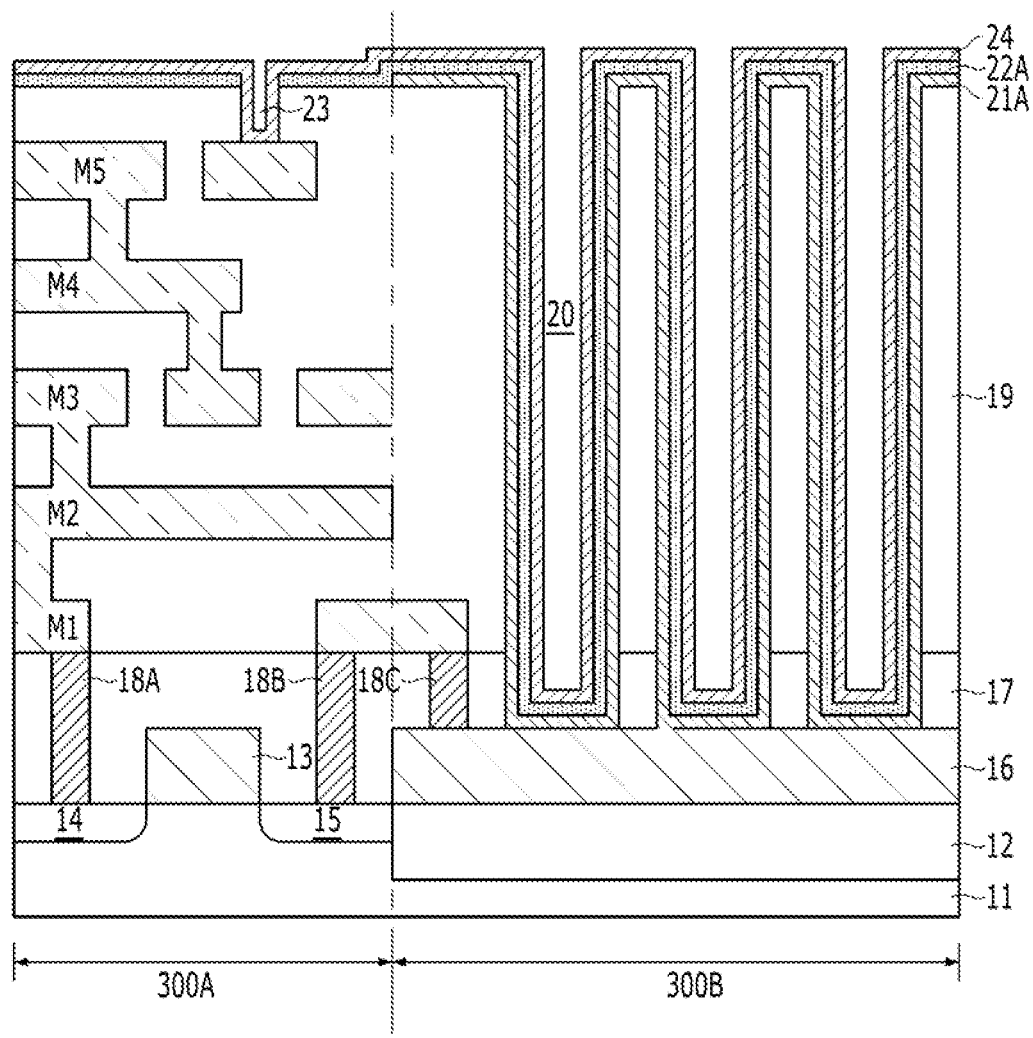

Referring to FIG. 3J, the top plate 24 is formed over the structure including the via hole 23 and the openings 20. The top plate 24 is formed to have such a thickness that it does not gap-fill the via hole 23 and the openings 20. The top plate 24 may conformally cover the surface of the structure including the via hole 23 and the openings 20. The top plate 24 includes a titanium-containing layer. The top plate 24 may be formed of one selected from the group consisting of a titanium layer and a titanium nitride layer. For example, the top plate 24 may include a titanium nitride layer. The top plate 24 may be formed using an Atomic Layer Deposition (ALD) process or a Chemical Vapor Deposition (CVD) process. The top plate 24 formed in the via hole 23 of the first region 300A may be used as a barrier metal.

A capacitor is formed where the bottom plate 21A coupled sequentially with the landing plate 16 of the second region 300B, the dielectric layer formed over the bottom plate 21A, and the top plate 24 formed over the dielectric layer are stacked.

Figure 3K:
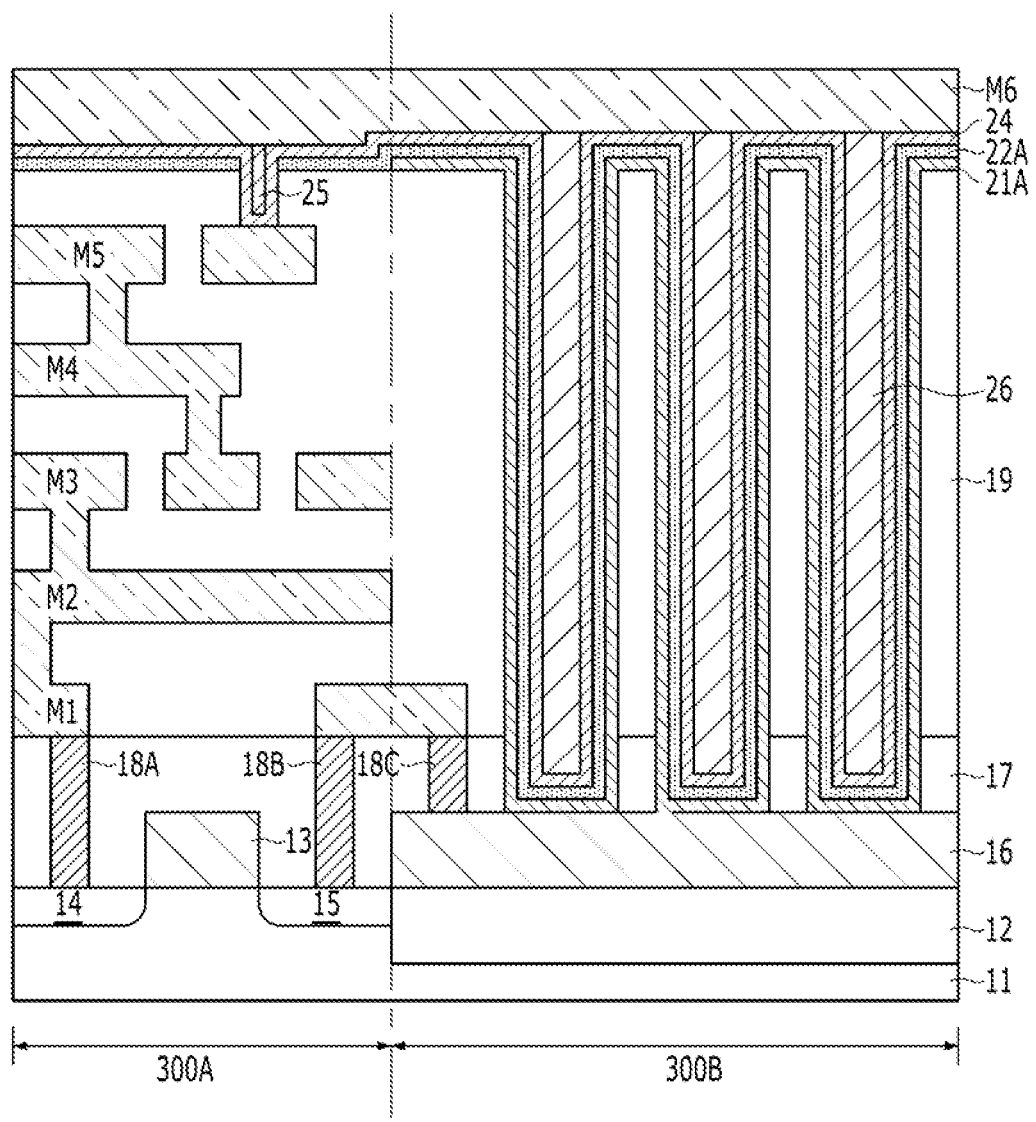

Referring to FIG. 3K, a third conductive layer which covers the first and second regions 300A and 300B is formed. Subsequently, a planarization process is performed on the third conductive layer until the surface of the top plate 24 is exposed. The planarization process may be performed using a Chemical Mechanical Polishing (CMP) process. As a result, a plurality of plugs may be formed to gap-fill the via hole 23 and the openings 20. The plugs include a first via plug 25 of the first region 300A and a second via plug 26 of the second region 300B. The plugs may be formed of a metallic layer. The metallic layer may include a metal layer, a metal oxide layer, a metal nitride layer, etc. For example, the plugs may include a tungsten layer.

A sixth metal line M6 is formed to cover the first and second regions 300A and 300B. The sixth metal line M6 includes the same material as the multi-layer metal lines. The transistor and the capacitor may be electrically connected to each other by forming the sixth metal lines M6.

In accordance with the embodiments of the present invention, the size of an occupying area in a device may be reduced as a cylindrical capacitor is formed around multi-layer metal lines.

In accordance with the embodiments of the present invention, capacitance may increase as a successive cylindrical capacitor is formed over a landing plate.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A direct current-to-direct current (DC-to-DC) converter, comprising:
a substrate having a switching element region and a capacitor region defined by an isolation layer;
a transistor formed over the switching element region;
a landing plate formed over the isolation layer;
a capacitor formed over the landing plate, wherein the capacitor includes a bottom plate, a dielectric layer and a top plate;
multi-layer metal lines disposed in an upper portion of the transistor and coupled with the transistor; and
an interconnection portion coupled with the multi-layer metal lines to electrically connect the transistor with the capacitor,
wherein the bottom plate has a form of continuum and extended to a boundary line between the switching element region and the capacitor region,
wherein the multi-layer metal lines are contacted with the top plate,
wherein the dielectric layer of the capacitor is extended to overlap with an upper portion of the multi-layer metal lines.

2. The DC-to-DC converter of claim 1, wherein the bottom plate has a successive cylindrical shape coupled to the landing plate, the dielectric layer is formed over the bottom plate, and the top plate is formed over the dielectric layer.

3. The DC-to-DC converter of claim 1, wherein the landing plate is disposed at the same surface level as a gate electrode of the transistor.

4. The DC-to-DC converter of claim 3, wherein the landing plate is formed of the same material as the gate electrode of the transistor.

5. The DC-to-DC converter of claim 1, wherein the landing plate is disposed at the same surface level as the lowermost metal line of the multi-layer metal lines.

6. The DC-to-DC converter of claim 5, wherein the landing plate is formed of the same material as the lowermost metal line of the multi-layer metal lines.

7. The DC-to-DC converter of claim 1, wherein the interconnection portion includes:
a first interconnection portion, which couples the landing plate with the transistor; and
a second interconnection portion, which couples the uppermost metal line of the multi-layer metal lines with the top plate of the capacitor.

8. The DC-to-DC converter of claim 7, wherein the second interconnection portion includes:
a barrier metal formed over the uppermost metal line;
a first via plug formed over the barrier metal;
a second via plug formed over the capacitor; and
interconnection lines formed over the first and second via plugs,
wherein the barrier metal is continuously extended to the uppermost metal line from the top plate of the capacitor.

9. A direct current-to-direct current (DC-to-DC) converter, comprising:
a substrate having a switching element region and a capacitor region defined by an isolation layer;
a transistor formed over the switching element region;
a landing plate formed over the isolation layer and electrically coupled to the transistor; and
a successive cylindrical capacitor including a bottom plate, a dielectric layer and a top plate formed over the landing plate, wherein the landing plate is electrically coupled with the transistor and successive cylindrical capacitor,
wherein the bottom plate has a form of continuum and extended to a boundary line between the switching element region and the capacitor region,
wherein multi-layer metal lines are contacted with the top plate,
wherein the dielectric layer of the capacitor is extended to overlap with an upper portion of the multi-layer metal lines.

10. The DC-to-DC converter of claim 9, wherein the successive cylindrical capacitor includes a bottom plate coupled to landing plate, a dielectric layer, and a top plate electrically coupled to the transistor.

11. The DC-to-DC converter of claim 10,
wherein the multi-layer metal lines disposed in an upper portion of the transistor and coupled to the transistor; and
an interconnection portion coupled to the multi-layer metal lines to electrically connect the transistor with the successive cylindrical capacitor.

12. The DC-to-DC converter of claim 1, further comprising:
an inter-layer insulation layer having trenches and formed over the landing plate,
wherein the bottom plate included in the capacitor is formed along an upper surface, sidewalls and a bottom surface of the inter-layer insulation layer having the trenches.

13. The DC-to-DC converter of claim 9, further comprising:
an inter-layer insulation layer having trenches and formed over the landing plate,
wherein the bottom plate included in the successive cylindrical capacitor is formed along an upper surface, sidewalls and a bottom surface of the inter-layer insulation layer having the trenches.

* * * * *